United States Patent [19]
Vig

[11] Patent Number: 5,218,298
[45] Date of Patent: Jun. 8, 1993

[54] TWO-TERMINAL-HALL-SENSORS MONITORING SYSTEM FOR PROVIDING DECODED MAGNETIC FIELD AMPLITUDE SIGNALS AND SYSTEM DIAGNOSTIC SIGNALS

[75] Inventor: Ravi Vig, Concord, N.H.

[73] Assignee: Allegro Microsystems Inc., Worcester, Mass.

[21] Appl. No.: 844,076

[22] Filed: Mar. 2, 1992

[51] Int. Cl.⁵ .................... G01R 33/06; G01R 31/02; G08C 15/06; G08B 21/00

[52] U.S. Cl. ..................... 324/251; 307/309; 324/207.2; 324/537; 340/438; 340/635; 340/661; 340/870.13

[58] Field of Search ............. 324/207.20, 207.21, 324/251, 252, 537, 117 H, 173, 174; 307/309; 340/438, 635, 870.13, 514, 516

[56] References Cited

U.S. PATENT DOCUMENTS

| | | | |
|---|---|---|---|
| 3,661,089 | 5/1972 | Soltz | 324/251 X |
| 4,374,333 | 2/1983 | Avery | 324/251 X |
| 4,518,918 | 5/1985 | Avery | 324/251 X |
| 4,791,311 | 12/1988 | Vig | 340/438 X |
| 4,845,435 | 7/1989 | Bohan, Jr. | 324/537 |
| 4,881,071 | 11/1989 | Monterosso et al. | 340/870.13 |
| 4,901,008 | 2/1990 | Quastel et al. | 324/251 X |
| 4,982,155 | 1/1991 | Ramsden | 324/251 X |
| 5,045,920 | 9/1991 | Vig et al. | 324/251 X |
| 5,093,618 | 3/1992 | Goto et al. | 324/248 |
| 5,142,235 | 8/1992 | Matsumoto et al. | 324/537 |

Primary Examiner—Gerard R. Strecker

[57] ABSTRACT

A magnetic-field monitor includes a Hall sensor of the kind having a voltage reference terminal and a signal output terminal for being energized by applying a DC voltage across the output terminal and the reference terminal, and generates through the output terminal a low value current when the ambient magnetic field strength is low and a high output current when the magnetic field is high. The Hall sensor is connected via a pair of conductors to a Hall-sensor decoder circuit that is energized by a DC voltage source and in turn energizes the sensor via the pair of conductors. The decoder includes a current mirror circuit that mirrors the Hall-sensor current into a voltage divider. Three voltage comparators having different threshold voltages are connected at three points in the voltage divider. The three binary output signals of the comparators constitute a composite binary indication whether a short circuit fault or an open circuit fault condition exists in the conductors connecting the Hall element to the decoder, and when there is no fault further indicates whether the ambient magnetic field at the remote Hall sensor is high or low. A system including four such monitors is described wherein the fault signals are combined and the real time indication of the magnetic-field status at each remote sensor is continuously provided.

5 Claims, 4 Drawing Sheets

FIG. 3
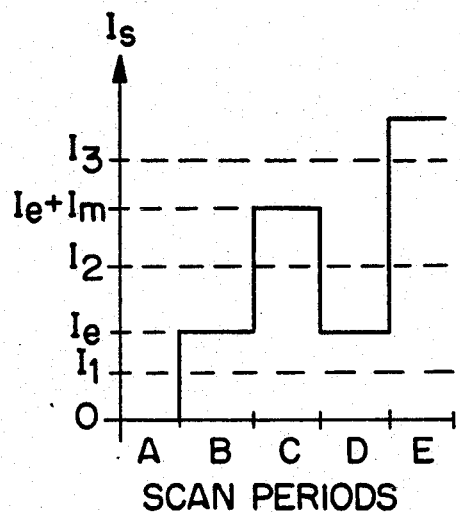
SCAN PERIODS
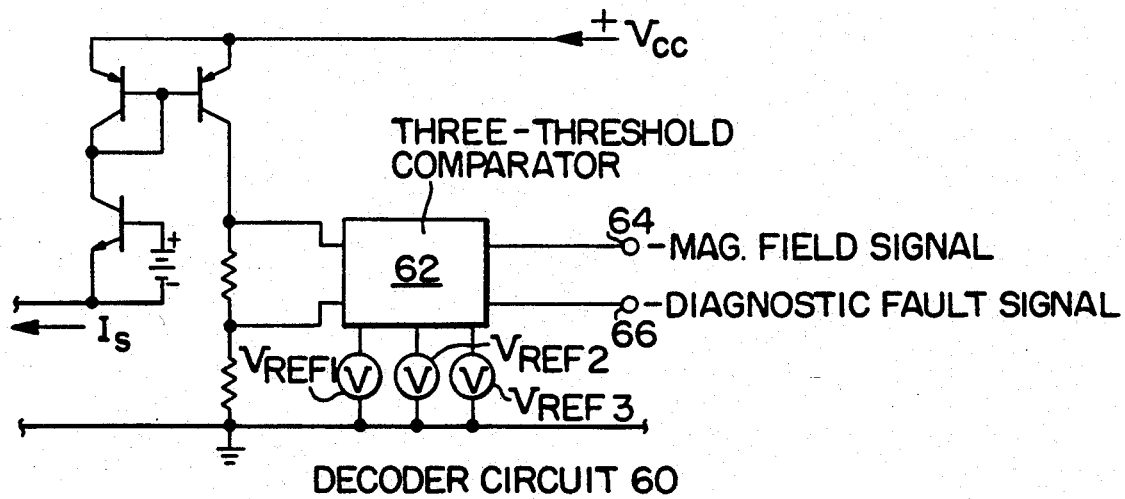
FIG. 4

TWO-TERMINAL-HALL-SENSORS MONITORING SYSTEM FOR PROVIDING DECODED MAGNETIC FIELD AMPLITUDE SIGNALS AND SYSTEM DIAGNOSTIC SIGNALS

BACKGROUND OF THE INVENTION

This invention relates to two-terminal Hall sensors and their use in magnetic field monitoring systems, and more particularly pertains to a monitoring systems with fault detection and diagnostic capabilities wherein each of a plurality of remote Hall sensors are connected by two conductors to a sensors-addressing and control module.

A two terminal Hall sensor is described in the U.S. Pat. No. 4,374,333 to Grant Avery, issued Feb. 15, 1983 and assigned to the same assignee as is the present invention. This integrated circuit Hall sensor includes an on-board voltage regulator and the output stage is a current source providing an output current of predetermined value when the ambient magnetic field exceeds a prescribed value and no output current otherwise.

Such two terminal Hall sensors are employed in a vehicle monitoring system that is described in the U.S. Pat. No. 4,791,311 to Ravi Vig, issued Dec. 13, 1988 and assigned to the same assignee as is the present invention. These remote multiplexible two-terminal Hall sensors are all connected in parallel along a single pair of conductors and to a control module that addresses each sensor in sequence by multiplexing signals; the wiring is greatly simplified whereas the sensors must be multiplex-addressable.

The system of the present invention is intended for building security systems and vehicle monitoring tasks wherein simplicity and reliability are foremost considerations, and distinguishes from the multiplexing system in U.S. Pat. No. 791,311 by employing a plurality of simple switching two-terminal Hall sensors, e.g. as described in U.S. Pat. No. 4,374,333 each Hall sensor being connected to the control module by its own wire(s).

It is an object of this invention to provide such a vehicle monitoring system that uses a simple control module for switching from one Hall sensor to the next and for detecting and decoding in each Hall sensor the output current to determine whether a fault exists between the control module and the sensor and if not whether the magnetic field strength exceeds a certain value there.

SUMMARY OF THE INVENTION

In a first embodiment of this invention, a magnetic-field monitor includes a Hall sensor of the kind having a voltage reference terminal and a signal output terminal for being energized by applying a DC voltage across the output terminal and the reference terminal. The two terminal Hall sensor is adapted for generating through the output terminal an output current of a low amplitude Ie when the ambient magnetic field strength at the sensor lies within a first predetermined range M1 and generates a relatively high output signal current (Ie+Im) when the ambient magnetic field strength lies within a second predetermined range M2.

A Hall-sensor decoder circuit includes a signal input terminal that is connected by one conductor to the Hall-sensor output terminal and a ground terminal connected to the Hall-sensor reference terminal. The decoder circuit also has a supply voltage terminal to which a DC energizing voltage source may be connected, and a current mirror circuit having an input branch connected between the voltage supply terminal and the signal input terminal. A resistive voltage divider circuit is connected in the output branch of the current mirror circuit and to the decoder ground terminal. The decoder circuit further includes three voltage comparators, each comparator having a different threshold voltage and the inputs of the three comparators are connected respectively to three points in the voltage divider circuit.

The three composite binary output signals from the decoder indicate whether a short circuit fault or an open circuit fault condition exists in the conductors connecting the Hall element to the decoder, and when there is no fault further indicates whether the ambient magnetic field at the remote Hall sensor is high or low, e.g. whether a magnet is close by or remotely distant from the sensor.

In a second embodiment of this invention, a magnetic-field monitor system includes a plurality of Hall sensors of the kind employed in the first embodiment. A clocked sequential switch sequentially connects the output of each Hall sensor in turn to a signal Hall-sensor decoder of the kind used in the first embodiment.

In a third embodiment, another magnetic-field monitor system includes a plurality of Hall sensors of the same kind as in the first embodiment, but also includes a plurality of Hall-sensor decoders of the kind used in the first embodiment. Each sensor is connected directly to a corresponding one of the decoders via a separate pair of conductors, respectively. The outputs of all the decoders are connected to a logic circuit that produces, when there are no circuit fault conditions, binary signals indicating at every instant the magnetic field status at every Hall sensor and providing a fault signal whenever a fault occurs. This real time magnetic-field monitoring system is especially suitable for use in an automatic braking system (ABS) of a vehicle.

BRIEF DESCRIPTION OF THE DRAWINGS

FIG. 3 shows a graph depicting total sensor current, Is, in the decoder of FIG. 2 under different field and fault conditions, and depicting decoder-comparator threshold values in a monitoring system of this invention.

FIG. 4 shows a circuit diagram of another Hall-sensor signal decoder of this invention.

DESCRIPTION OF THE PREFERRED EMBODIMENTS

Figure 1:
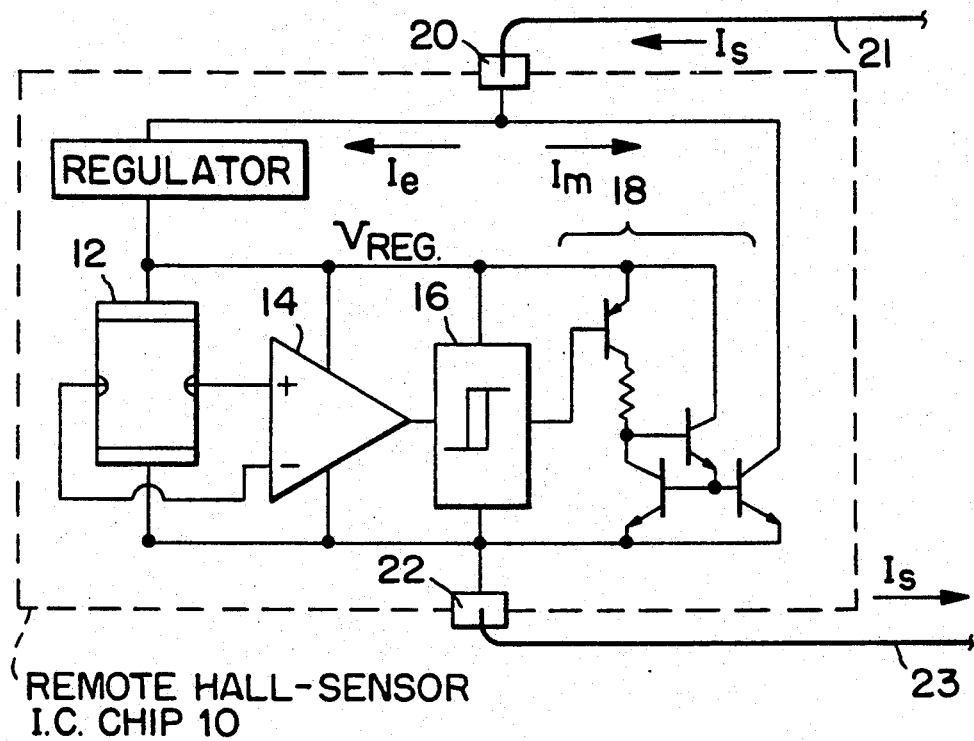
FIG. 1 shows a circuit diagram of two-terminal integrated-circuit Hall sensor of the prior art.

The two-terminal integrated circuit Hall sensor 10 of FIG. 1 includes a Hall element 12, a Hall-voltage amplifier 14, a Schmitt trigger circuit 16 and a switchable current source 18 all of which are connected in tandem. When a positive DC exciting voltage is connected, via conductor 45 and transistors 28 and 32 of the decoder circuit 26 of FIG. 2 to the terminal 20, with respect to the ground or reference terminal 22, the current flowing through terminal 20 and lead conductor 21 consists of the exciting current, Ie, plus any current that may be generated by the current source 18. The current source 18 is caused to produce an output current Im of predetermined amplitude only when the ambient magnetic field at the sensor exceeds a certain magnitude. Thus the total current, Is, in terminal 20 and lead conductor 21 is composed only of the exciting current Ie when the magnetic field is less than the certain magnitude, and otherwise is composed of the total current Ie + Im when the magnetic field is greater than the certain magnitude. Thus to know the amplitude of the total current Is, is to know the range of ambient magnetic field strength. And, the same current Is flows in both terminals 20 and 22 as well as in both lead wires 21 and 23 so that detection can be effected at any point in this series circuit.

Figure 2:
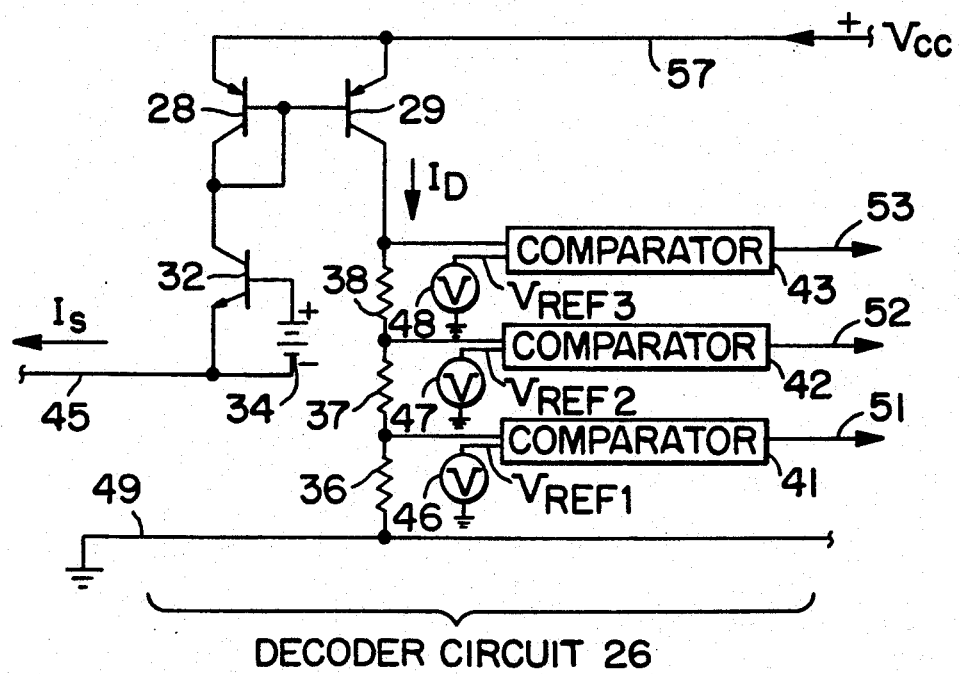
FIG. 2 shows a circuit diagram of a Hall-sensor signal decoder of the present invention.

The Hall-sensor signal decoder 26 of FIG. 2 is composed of a current mirror circuit including transistors 28 and 29, a saturating high-current protection circuit including the transistor 32 and voltage source 34, a voltage divider circuit including resistors 36, 37 and 38, and three comparators 41, 42 and 43. Decoder circuit 26 is to be connected to the output of a Hall sensor such as the sensor 10 of FIG. 1. When the reference conductor 23 of chip 10 is connected to ground, as is the conductor lead 49 of decoder circuit 26, and sensor lead 21 is connected to decoder lead 45, then a current Id, which is proportional to the Hall sensor current Is, flows through the divider resistors 36, 37 and 38.

To the reference inputs of the comparators, there are respectively connected the three reference voltage sources 46, 47 and 48 which establish the three threshold voltages Vref1, Vref2 and Vref3. The comparators 41, 42 and 43 produce at their respective outputs 51, 52 and 53 a binary zero signal when their respective signal inputs (appearing at the top of resistors 36, 37 and 38) are less than the corresponding threshold voltages Vref1, Vref2 and Vref3. On the other hand, when the input voltage to any one of the comparators is greater than the corresponding threshold reference voltage, that comparator produces at its output a binary one signal.

Now with reference to FIG. 3 and the Truth Table below, the decoder circuit 26 generates three binary output signals at the decoder outputs 51, 52 and 53 reflecting the status of the connected Hall sensor 10 and its wiring to the decoder input.

For example, Vref1 is established at a level $I_1$ below that which corresponds to the Hall-sensor exciting current, Ie, so that if an open circuit has developed in conductors 21 and 23 between the sensor 10 and the decoder 26, the exciting current drops or becomes zero and the output 51 of comparator 41 becomes a binary zero (L).

Similarly, Vref3 is established at a level above that which corresponds to a maximum total Hall-sensor output current, Ie + Im, under the conditions of no faults and existence of an ambient magnetic field at the connected sensor 10. Thus when an open circuit or high resistance develops in the connection between the sensor 10 and the decoder 26, then the output 53 of comparator 43 becomes a binary one (H) whereas without the open circuit fault it would have been a binary zero (L).

The threshold voltage Vref2 is established about in the center of the range of voltages appearing at the signal input of comparator 42 corresponding to the ambient magnetic field at sensor 10 so that the Schmitt trigger circuit is operating at about the center of its hysteresis loop, and under the condition of no-faults in the connection between the sensor 10 and the decoder 26.

Referring to FIG. 3, with the assumption that the base-emitter areas of current mirror transistors 28 and 29 are the same, the comparator reference voltages are each related to corresponding Is threshold current as follows:

$I_1 = Vref1/R_{36}$ $I_2 = Vref2/(R_{36} + R_{37})$ $I_3 = Vref3/(R_{36} + R_{37} + R_{38})$ Truth Table I summarizes the operation of decoder

TRUTH TABLE I

| Typical Currents Ip | Is | Fault | Magnetic Field | Decoder 26 Binary Output 51 | 52 | 53 |
|---|---|---|---|---|---|---|
| <3 ma | Is < $I_1$ | OPEN | — | L | L | L |
| 3–10 ma | $I_1$ < Is < $I_2$ | — | LOW | H | L | L |
| 10–20 ma | $I_2$ < Is < $I_3$ | — | HIGH | H | H | L |
| >20 ma | Is > $I_3$ | SHORT | — | H | H | H |

An alternate decoder circuit 60 having similar features is shown in FIG. 4 whereby a single three-threshold comparator 62 provides a magnetic-field status binary signal at output conductor 64, and a fault condition binary signal at output terminal 66 indicates any fault, e.g. goes high for either a short or an open fault condition. Under fault conditions, either short or open, it is desirable to use the binary fault indicator signal to shut down the monitoring system to avoid producing an erroneous magnetic-field indication, and further to turn on a fault alarm.

Figure 5:
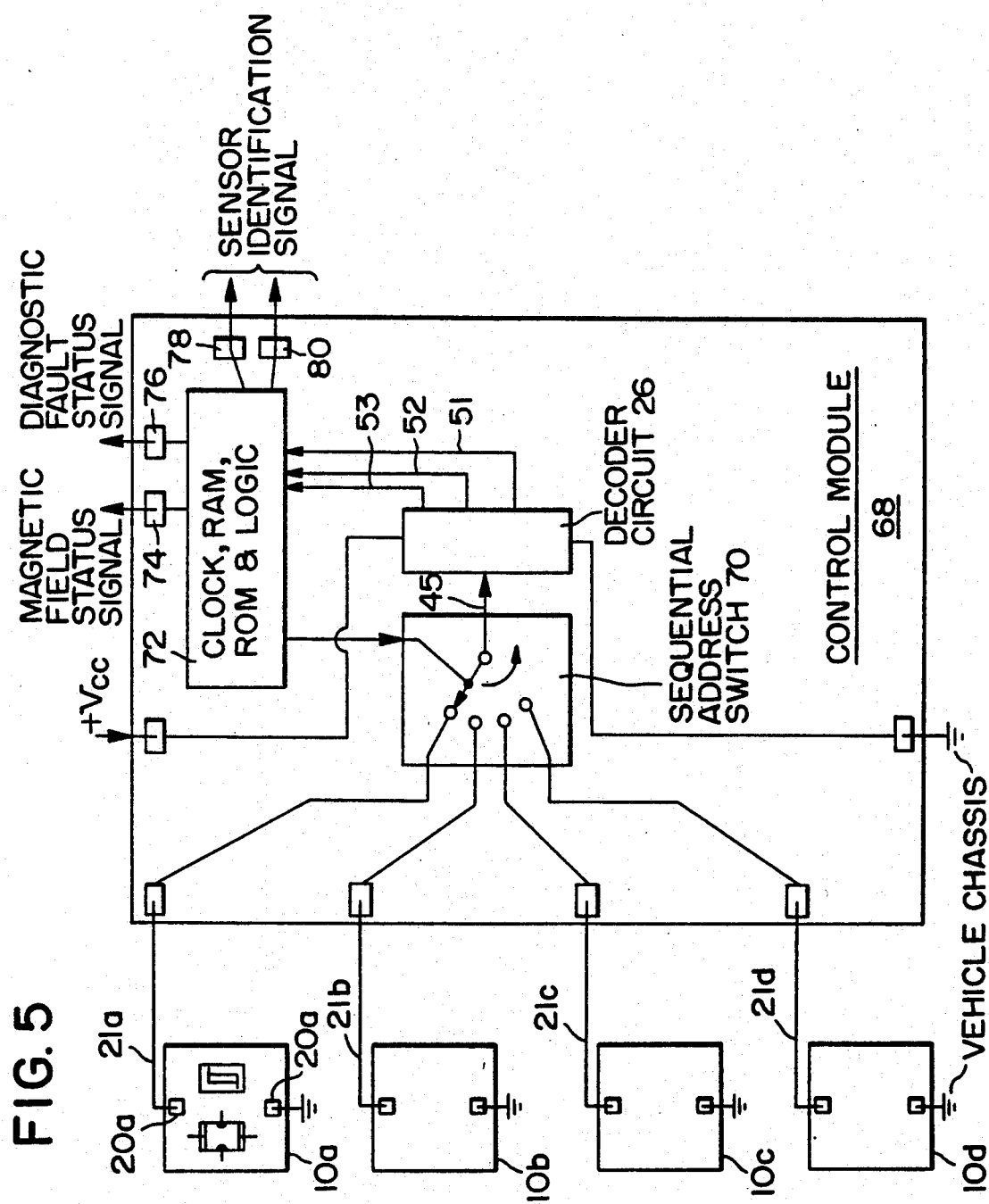
FIG. 5 shows a block diagram of a monitoring system of this invention suitable for use in a building-security system.

Referring now to FIG. 5, a monitoring system employs four essentially identical Hall sensors 10a, 10b, 10c and 10d that are the same or equivalent to the Hall sensor 10 of FIG. 1. Each of the four Hall sensors (e.g. 10a) has its primary terminal (e.g. 21a) connected to a microprocessor control module 68. The control module 68 includes a sequential address switch 70 that sequentially connects each of the four Hall sensors for a fixed period of time in turn, via conductor 45 to the input of the decoder 26. During that each period, the connected Hall sensor is excited by application of Vcc (or scaled down portions thereof) and the magnetic field status and the fault status of the connected Hall sensor is indicated by the binary signals produced at outputs 51, 52 and 53 of decoder 26. The switch 70, and therefore the time periods during which each Hall sensor is excited, are under control of a clock and logic circuit 72. Circuit 72 may also include memory (RAM and/or ROM) for remembering the fault status and the identity of its associated Hall sensor. A binary magnetic-field (high or low) status signal is produced at terminal 74 and a binary fault status signal is generated at terminal 76. The Hall sensor identification signal is provided in a composite two-digit binary form at terminals 78 and 80. All three of these output signals may be said to be contained in "the signal" produced at the composite four-digit binary output composed of the four terminals 74, 76, 78 and 80.

Figure 6:
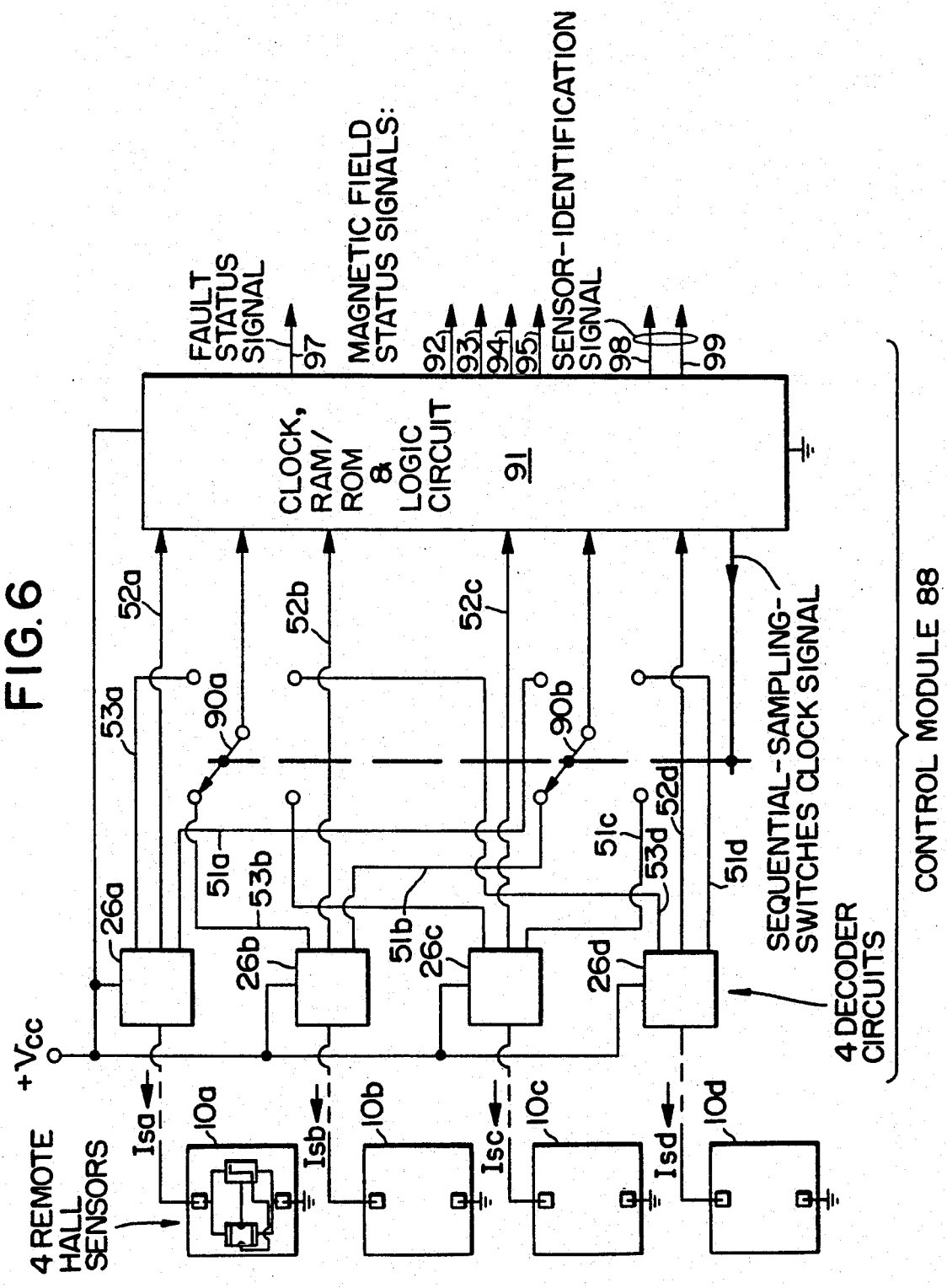
FIG. 6 shows a block diagram of another monitoring system of this invention that is suitable for use in an anti-skid vehicle-braking system.

Referring now to FIG. 6, another monitoring system is shown also employing the four essential identical Hall sensors 10a, 10b, 10c and 10d, each of the four Hall sensors having its primary terminal (e.g. 21a) connected to a corresponding one of four decoders 26a, 26b, 26c and 26d, respectively. A microprocessor control module 88 includes clocked address switches 90a and 90b that sequentially connect the pair of faults output signals from each of the four Hall decoders, e.g. via a pair of conductors 51d and 53d, to the logic circuit 91, and in subsequent periods respectively via the pairs of fault-signal conductors 51a/53a, 51b/53b and 51c/53c. The decoders 26a through 26d are identical to the decoder 26 of FIG. 2. Unlike for the monitoring system of FIG. 5, the four sensors 10a through 10d are continuously energized via the four decoders 26a through 26d respectively. Thus each continuously produces a binary magnetic-field indicating signal at the field status outputs 92, 93, 94 and 95 of logic circuit 91 and control module 88, unless a fault condition is present. A fault, either a short or an open, is indicated by a binary fault signal at output terminal 97 of the control module 88 and the sensor with which the fault is associated is indicated by the binary signal appearing at the output conductors pair 98 and 99.

Monitoring systems of this invention are especially well suited for use in a vehicle automatic braking system (ABS) wherein the relative rotational positions of each of four wheels could be detected and monitored and controlled (especially for skid sensing and control) by mounting a multiple-tooth ferrous gear to each wheel, assembling magnets to the Hall sensors and mounting the Hall sensor/magnet assemblies near the rotating teeth of the gears to sense each tooth passing by a Hall sensor. The integrated circuit Hall sensors employed in the vehicle monitoring system of this invention may be of the dual Hall type that work especially well for gear tooth detection. Descriptions of such dual Hall sensors are provided in U.S. Pat. No. 4,518,918 issued May 21, 1985 and U.S. Pat. No. 5,045,920 issued Sept. 3, 1991, both being assigned to the same assignee as is the present invention.

What is claimed is:

1. An elementary magnetic-field monitor including a Hall sensor of the kind having a voltage reference terminal and a signal output terminal for being energized by applying a DC voltage across said output terminal and said reference terminal, said Hall sensor adapted for generating through said output terminal an output current of a low amplitude Ie when the ambient magnetic field strength at said sensor lies within a first predetermined range M1 and generates a relatively high output signal current (Ie+Im) when the ambient magnetic field strength lies within a second predetermined range M2, wherein the improvement comprises:

a Hall-sensor decoder circuit comprising:
(a) a signal input terminal connected by one conductor to said Hall-sensor output terminal and a ground terminal connected to said Hall-sensor reference terminal;
(b) a supply voltage terminal to which a DC energizing voltage source may be connected for energizing said decoder circuit;
(c) a circuit ground terminal;
(d) a current mirror circuit having an output branch, and having an input branch connected between said voltage supply terminal and said signal input terminal so that said decoder energizing voltage source is the source of the DC voltage to energize said Hall sensor;
(e) a resistive voltage divider circuit connected in said output branch of said current mirror circuit to said ground terminal; and
(e) three voltage comparators, each comparator having an input and each comparator having a different threshold voltage, said inputs of said comparators connected respectively to three points in said voltage divider circuit, said comparators generating three binary output signals that together reflect the magnetic field and status of said conductors between the Hall sensors and the decoder input.

2. An elementary magnetic-field monitor comprising:
(a) an integrated circuit Hall sensor of the kind having a voltage reference terminal and a signal output terminal for being energized by applying a DC voltage across said reference terminal, said Hall sensor adapted for generating through said output terminal an output current of a low amplitude Ie when the ambient magnetic field strength at said sensor lies within a first predetermined range M1 and generates a relatively high output signal current (Ie+Im) when the ambient magnetic field strength lies within a second predetermined range M2;
(b) a Hall-sensor decoder means having an input connected respectively by two conductors to said voltage reference and output terminal of said Hall sensor, a supply voltage terminal to which a decoder-means energizing DC voltage source may be connected, and a group of binary outputs, said decoder means being for applying the Hall-sensor energizing DC voltage derived from said DC voltage source to said Hall sensor output terminal and generating a composite binary signal at said group of decoder means outputs, whereby:
when the output signal current from said connected Hall sensor lies in a low current range from zero to a first threshold current level I1, the composite binary signal at said decoder outputs corresponds uniquely to that low current range I1 indicating an open-circuit fault condition;
when the output signal current from said connected Hall sensor lies in an intermediate range between the first current level and a second higher level I2, the composite signal at said decoder outputs corresponds uniquely to that intermediate range, indicating a no fault condition and an ambient magnetic field strength within the first range M1;
when the output signal current from said connected Hall sensor lies in a middle range between the second and a third higher yet threshold current level I3, the composite signal at said decoder outputs corresponds uniquely to that middle range, indicating a no fault condition and an ambient magnetic field strength within the second range M2;
when the output signal current from said connected Hal sensor lies in a high range between the third current level and a fourth even higher level I4, the composite signal at said decoder outputs corresponds uniquely to that high range, indicating a short-circuit fault condition.

3. The elementary magnetic-field monitor of claim 2 wherein said decoder means is comprised of a current mirror circuit having an input branch connected between said DC power supply terminal and said input of said decoder means, having an output branch at least two voltage-divider resistors connected in series with said output branch of said current mirror circuit, and three voltage comparators, each comparator having an input, said inputs of said comparators connected respectively to three points in said voltage divider, said comparators being for providing said composite binary signal at said group of decoder means outputs.

4. A magnetic-field monitoring system comprising a plurality of elementary magnetic-field monitors according to claim 2; a logic circuit means having a binary fault indicating output and a binary magnetic-field status output; and a clocked sequential address switching means connected between at least two of said group of binary outputs of each of said monitor decoder means and said logic circuit means, and being for sequentially connecting said group of binary decoder means outputs to said logic circuit means, said logic circuit means being for
  (a) generating a binary signal at said magnetic-field status output that in one state corresponds to the intermediate range of output signal current from the connected Hall sensor, and in the other state corresponds to the middle range of output signal current from the connected Hall sensor, and
  (b) generating a binary signal at said fault-indicating output that in one state corresponds to either the high or low range of output signal current from the connected Hall sensor, and in the other state corresponds to the middle and intermediate range of output signal current from the connected Hall sensor.

5. A magnetic-field monitor system comprising:
  (a) a plurality of integrated circuit Hall sensors for being mounted, respectively, at a plurality of remote locations, each of said Hall sensors being of the kind having a voltage reference terminal and a signal output terminal for being energized by applying a DC voltage across said output terminal and said reference terminal, said each Hall sensor generating through said output terminal an output current of a low amplitude Ie when the ambient magnetic field strength at said each sensor lies within a first predetermined range M1 and generates a relatively high output signal current (Ie+Im) when the ambient magnetic field strength lies within a second predetermined range M2;
  (b) a decoder circuit means having an input, a supply voltage terminal to which a DC voltage source may be connected for energizing said decoder circuit means, and a group of binary outputs; a sequential address switch means connected between said Hall sensor outputs and said decoder means input for sequentially switching said output terminal of each of said plurality of Hall sensors for a period of time to said input of said decoder circuit; said decoder means being additionally for, during each period of said switching said each Hall sensor output terminal to said decoder means input, supplying the Hall sensor energizing DC voltage by connecting said DC voltage source to said Hall sensor output terminal and generating a composite binary signal at said group of decoder means outputs, whereby:
    when the output signal current from said connected Hall sensor lies in a low current range from zero to a first threshold current level I, the composite binary signal at said decoder outputs corresponds uniquely to that low current range I1 to indicate an open-circuit fault condition;
    when the output signal current from said connected Hall sensor lies in an intermediate range between the first current level and a second higher level I2, the composite signal at said decoder outputs corresponds uniquely to that intermediate range, indicating a no fault condition and an ambient magnetic field strength within the first range M1;
    when the output signal current from said connected Hall sensor lies in a middle range between the second and a third higher yet threshold current level I3, the composite signal at said decoder outputs corresponds uniquely to that middle range, indicating a no fault condition and an ambient magnetic field strength within the second range M2;
    when the output signal current from said connected Hall sensor lies in a high range between the third current level and a fourth even higher level I4, the composite signal at said decoder outputs corresponds uniquely to that high range to indicate a short-circuit fault condition.

* * * * *